(12) United States Patent
Hsu et al.

(10) Patent No.: US 7,842,965 B2
(45) Date of Patent: Nov. 30, 2010

(54) LIGHT EMITTING DIODE ILLUMINATING DEVICE

(75) Inventors: Hung-Kuang Hsu, Miao-Li Hsien (TW); Chun-Wei Wang, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 248 days.

(21) Appl. No.: 12/135,871

(22) Filed: Jun. 9, 2008

(65) Prior Publication Data
US 2009/0168430 A1 Jul. 2, 2009

(30) Foreign Application Priority Data
Dec. 29, 2007 (CN) .................... 2007 1 0203565

(51) Int. Cl.
*H01L 33/00* (2010.01)
(52) U.S. Cl. .................... 257/99; 257/98; 362/800
(58) Field of Classification Search ............. 362/800, 362/646, 652, 640; 257/98, 415; 361/730, 361/732, 740
See application file for complete search history.

(56) References Cited

U.S. PATENT DOCUMENTS

| 6,388,883 B1* | 5/2002 | Serizawa et al. ............ 361/752 |
| 6,517,218 B2 | 2/2003 | Hochstein |
| 6,678,163 B1* | 1/2004 | Neal et al. .................. 361/729 |
| 6,819,036 B2 | 11/2004 | Cok |
| 6,982,518 B2 | 1/2006 | Chou et al. |
| 7,098,483 B2 | 8/2006 | Mazzochette et al. |
| 7,176,502 B2 | 2/2007 | Mazzochette et al. |
| 7,549,786 B2* | 6/2009 | Higley et al. ............... 362/646 |
| 7,659,551 B2* | 2/2010 | Loh .......................... 257/98 |
| 2005/0207165 A1 | 9/2005 | Shimizu et al. |
| 2006/0227554 A1 | 10/2006 | Yu |

FOREIGN PATENT DOCUMENTS

| CN | 1464953 A | 12/2003 |
| EP | 1830125 A1 | 9/2007 |
| EP | 1830125 A1 | 9/2007 |
| TW | I307252 | 3/2009 |
| WO | 2006/049086 A1 | 5/2006 |
| WO | WO 2006/049086 A1 | 5/2006 |

* cited by examiner

*Primary Examiner*—Anabel M Ton
(74) *Attorney, Agent, or Firm*—Andrew C. Cheng

(57) ABSTRACT

An illuminating device (1) includes a light source module (10) and a power source module (30). The light source module includes a base (11), a plurality of LEDs (12) and a plurality of electrode contacts (13, 14) located on the base. The LEDs is electrically connected to the electrode contacts. The power source module includes an enclosure (31) defining a light source chamber (311) therein and a plurality of electrical terminals (33, 34) received in the light source chamber. The light source module is detachably inserted into the light source chamber of the power source module, and the electrode contacts abut against the corresponding electrical terminals respectively.

14 Claims, 11 Drawing Sheets

LIGHT EMITTING DIODE ILLUMINATING DEVICE

BACKGROUND

1. Technical Field

The present invention generally relates to illuminating devices, and particularly to a light emitting diode illuminating device which is convenient to be assembled and disassembled.

2. Description of Related Art

With the continuing development of scientific technology, light emitting diodes (LEDs) have been widely used in illumination devices due to their high brightness, long life-span, and wide color gamut. LEDs emit visible lights at specific wavelengths and generate a significant amount of heat at the same time. Generally, approximately 80-90% of the power consumed by the LEDs is converted to heat, with the remainder of the power being converted to light. If the generated heat cannot be timely removed, LEDs may overheat, and thus their performance and life-span may be significantly reduced.

Referring to U.S. Pat. No. 6,517,218, an electrically driven LED assembly is disclosed. The LED assembly includes a plurality of LEDs and a heat sink attached to the LEDs. During assembly, the LEDs are fixedly secured to the heat sink, for preventing the LEDs from falling off from the heat sink.

However, it is very difficult to detach the LEDs from the heat sink when the LEDs need to be replaced, or repaired.

What is needed, therefore, is an LED illuminating device which can overcome the above-mentioned disadvantages.

SUMMARY

The present invention relates to an LED illuminating device. According to an exemplary embodiment of the present invention, the illuminating device includes a light source module and a power source module. The light source module includes a base, a plurality of LEDs, and a plurality of electrode contacts located on the base. The LEDs are electrically connected to the electrode contacts. The power source module includes an enclosure defining a light source chamber therein and a plurality of electrical terminals received in the light source chamber. The light source module is detachably inserted into the light source chamber of the power source module, and the electrode contacts abut against the corresponding electrical terminals respectively.

Other advantages and novel features of the present invention will become more apparent from the following detailed description when taken in conjunction with the accompanying drawings.

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION

Figure 1:
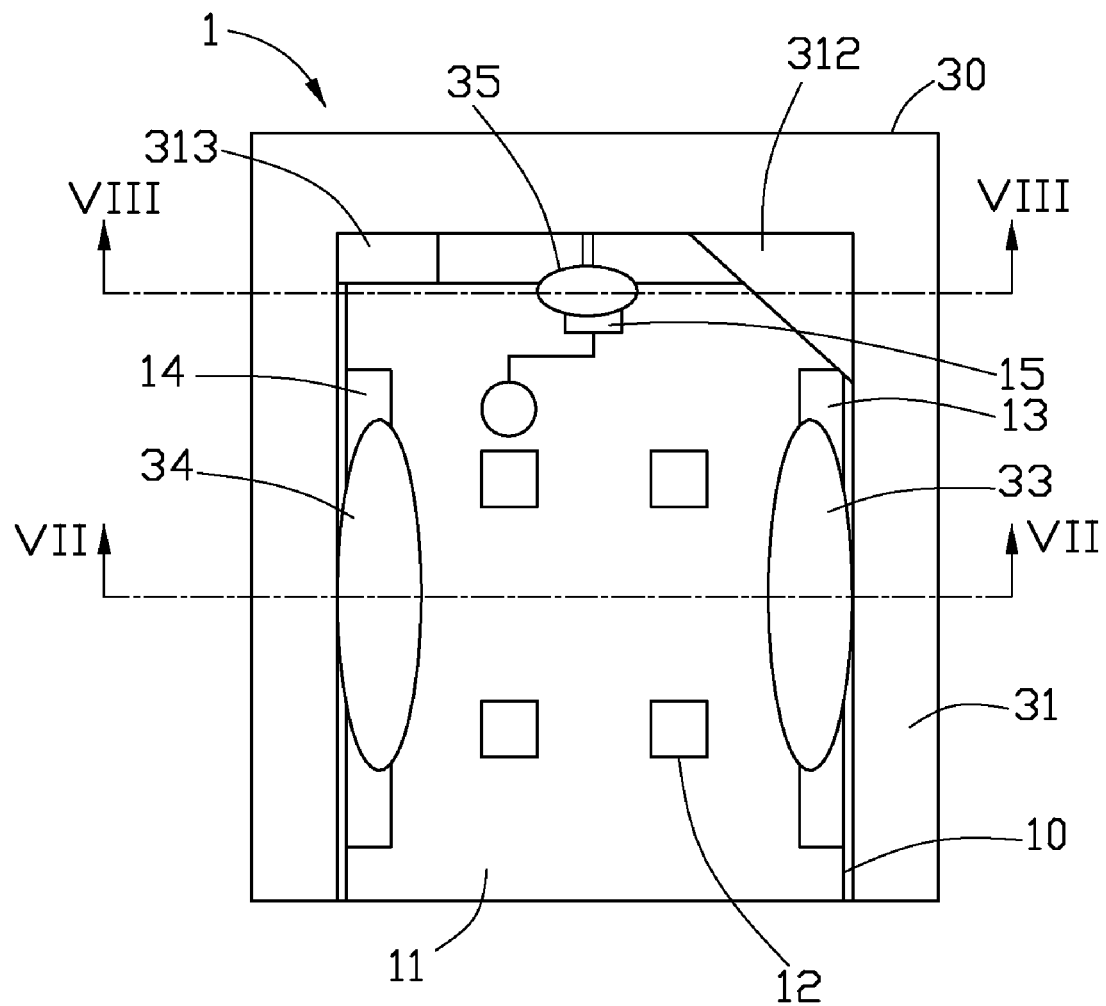
FIG. 1 is a schematic, top plan view of an LED illuminating device in accordance with a first embodiment of the present invention.

Referring to FIG. 1, an LED illuminating device 1 in accordance with a first embodiment of the present invention includes a light source module 10 and a power source module 30. The light source module 10 is enclosed in the power source module 30 and electrically connects to the power source module 30.

Figure 2:
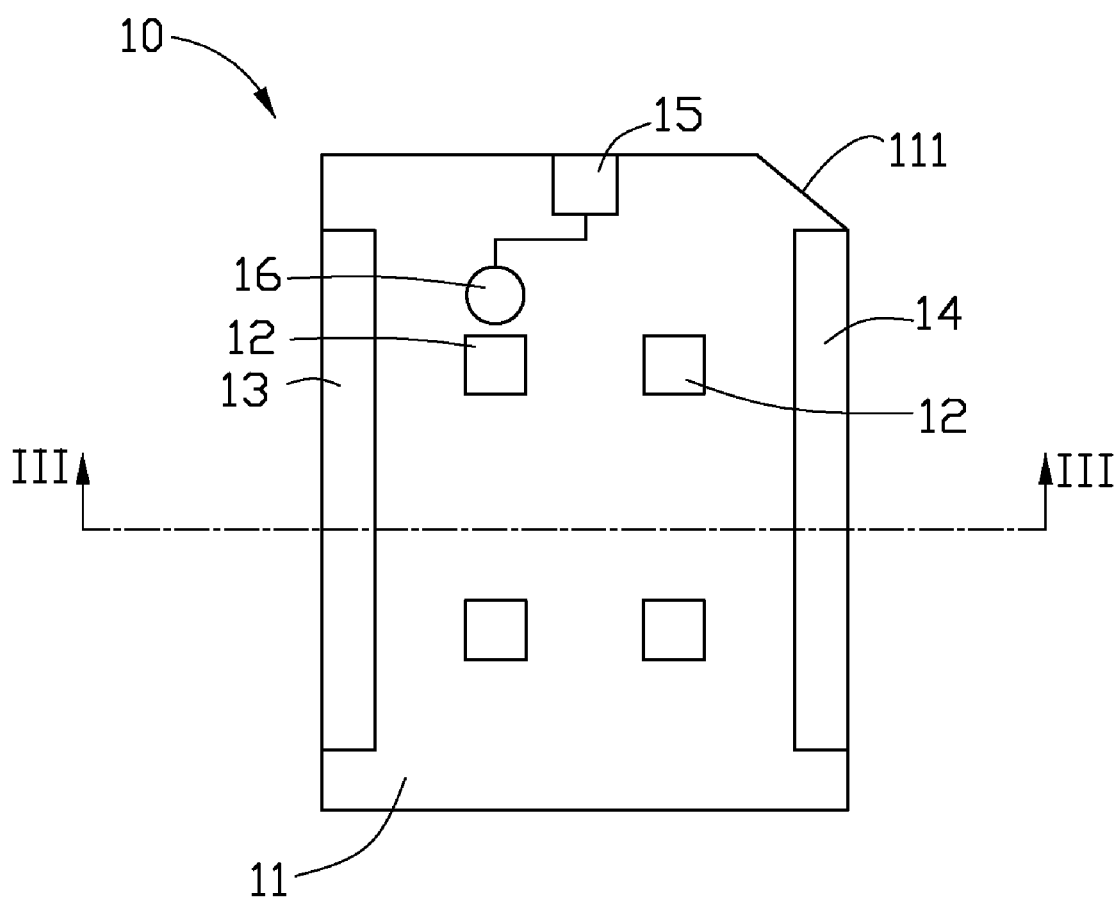
FIG. 2 is a schematic, top plan view of a light source module of the LED illuminating device of FIG. 1.
Figure 3:
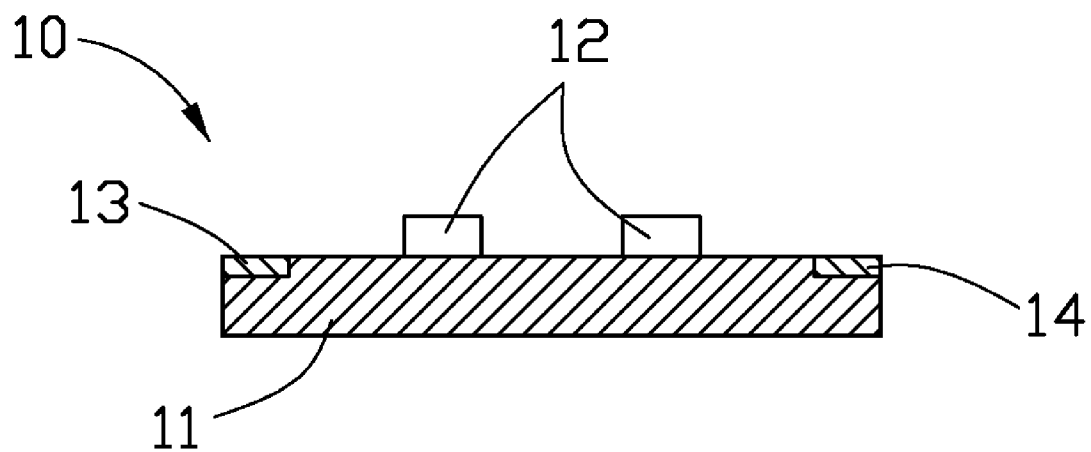
FIG. 3 is a schematic, cross-sectional view of the light source module of FIG. 2, taken along line III-III thereof.

Referring to FIGS. 2 and 3, the light source module 10 includes a circuit board 11 and a plurality of LEDs 12 attached to the circuit board 11, and first and second electrode contacts 13, 14 electrically connected to the LEDs 12.

The circuit board 11 has a rectangular shape, and defines a cutout 111 at a right rear corner thereof. In this embodiment, the cutout 111 is triangularly shaped. The cutout 111 can ensure that the light source module 10 is properly and accurately mounted to the power source module 30 during assembly. The circuit board 11 has good thermal conductive capability, such as metal core printed circuit board (MCPCB) and so on. A signal port 15 is formed at a top surface of the circuit board 11 and connects with a sensor 16 mounted on the circuit board 11. The sensor 16 is used to receive signals from outside, and outputs the signals via the signal port 15. The sensor 16 can be a temperature sensor for receiving temperature signals, a color sensor for receiving color signals or a brightness sensor for receiving brightness signals from outside.

The first and the second electrode contacts 13, 14 are respectively disposed at opposite lateral sides of a top surface of the circuit board 11. Each of the first and the second electrode contacts 13, 14 has an elongated shape, so that the first and the second electrode contacts 13, 14 have a large contact area for connecting to the power source module 30, which improves electrical connections between the first and second electrode contacts 13, 14 and the power source module 30.

Figure 4:
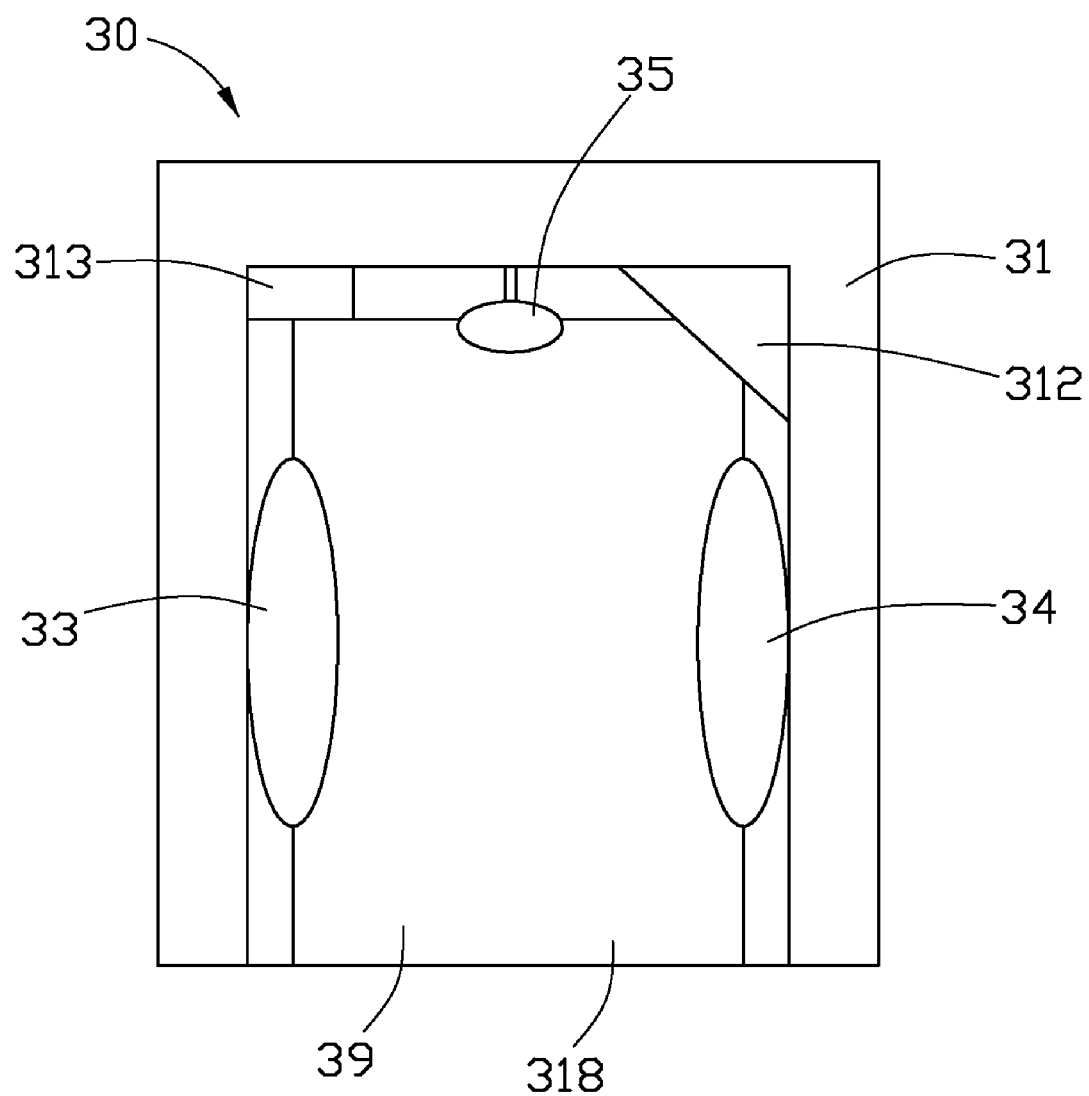
FIG. 4 is a schematic, top plan view of a power source module of the LED illuminating device of FIG. 1.
Figure 5:
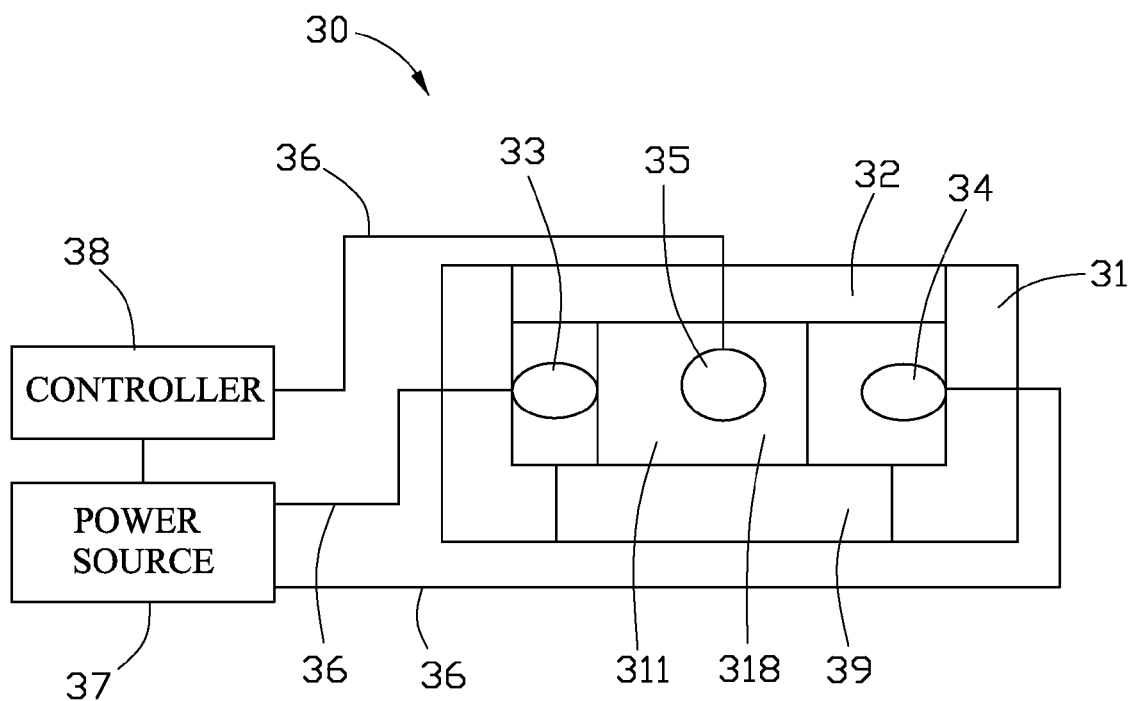
FIG. 5 is a schematic, front view of the power source module of FIG. 4.

Referring to the FIGS. 4 and 5, the power source module 30 includes an enclosure 31 and a lamp cover 32 covering the enclosure 31. The enclosure 31 defines a light source chamber 311 therein. The light source chamber 311 has a cuboid shape, and has an opening 318 at a front side thereof as viewed from FIG. 4, so that the light source module 10 can be conveniently inserted into the light source chamber 311 through the opening 318. A width of the light source chamber 311 is substantially equal to that of the light source module 10, so as to prevent the light source module 10 from disengaging the light source chamber 311. The power source module 30 has a protrusion 312 protruding into the light source chamber 311 from a rear and right corner thereof. The protrusion 312 corresponds to the cutout 111 of the circuit board 11 of the light source module 10.

Figure 6:
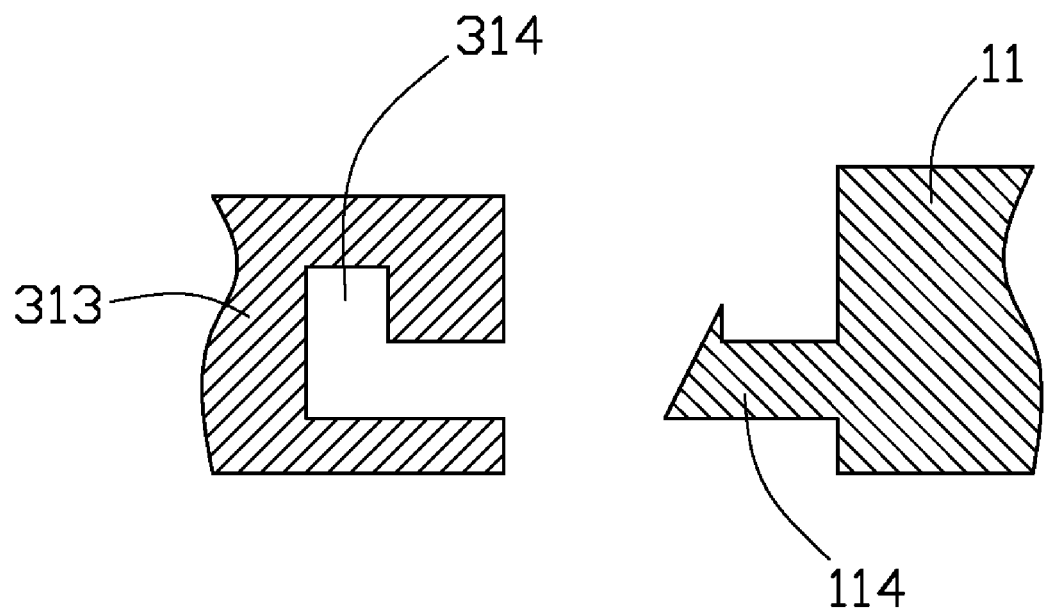
FIG. 6 is a schematic view showing an engagement of a fixing unit of the light source module of FIG. 4 and a base of the power source module of FIG. 2.

Referring to FIGS. 4 and 6, a first fixing unit 313 is formed at a rear and left corner of the light source chamber 311 of the power source module 30. The fixing unit 313 defines an L-shaped groove 314 therein, and the circuit board 11 of the light source module 10 further forms a second fixing unit corresponding to the first fixing unit 313. In this embodiment, the second fixing unit is an elastic hook 114 corresponding to the groove 314. The elastic hook 114 is used to be locked in the groove 314, for further ensuring that the light source module 10 is securely mounted relative to the power source module 30.

Referring to FIGS. 4 and 5, a heat dissipating block 39 is disposed below the light source chamber 311 of the enclosure 31. The heat dissipating block 39 is made of high thermally conductive materials, such as copper, aluminum and so on. The heat dissipating block 39 faces the light source module 10, and is detachably attached to the enclosure 31. Alternatively, the heat dissipating block 39 can be integrally formed with the enclosure 31 as a single piece. In this embodiment, the heat dissipating block 39 and the enclosure 31 are made of high thermally conductive materials, for cooperatively dissipating heat generated from the LEDs 12 of the light source module 10.

The lamp cover 32 covers a top of the light source chamber 311. The lamp cover 32 is located above and faces the light source module 10. The lamp cover 32 is a lens, such as plane lens, convex lens, concave lens, Fresnel lens and so on. Lights emitted from the LEDs 12 of the light source module 10 irradiate to outside from the lamp cover 32. Alternatively, the lamp cover 32 can form a plurality of microstructures on an outer surface thereof, so as to enable the lights to be evenly distributed on the lamp cover 32.

The power source module 30 further includes a first electrical terminal 33, a second electrical terminal 34 and a signal coupler 35. The first electrical terminal 33, the second electrical terminal 34 and the signal coupler 35 are received in the light source chamber 311. The first and the second electrical terminals 33, 34 are electrically connected to a power source 37 via electrical wires 36. The signal coupler 35 is electrically connected with a controller 38 via one of the electrical wires 36.

Figure 7:
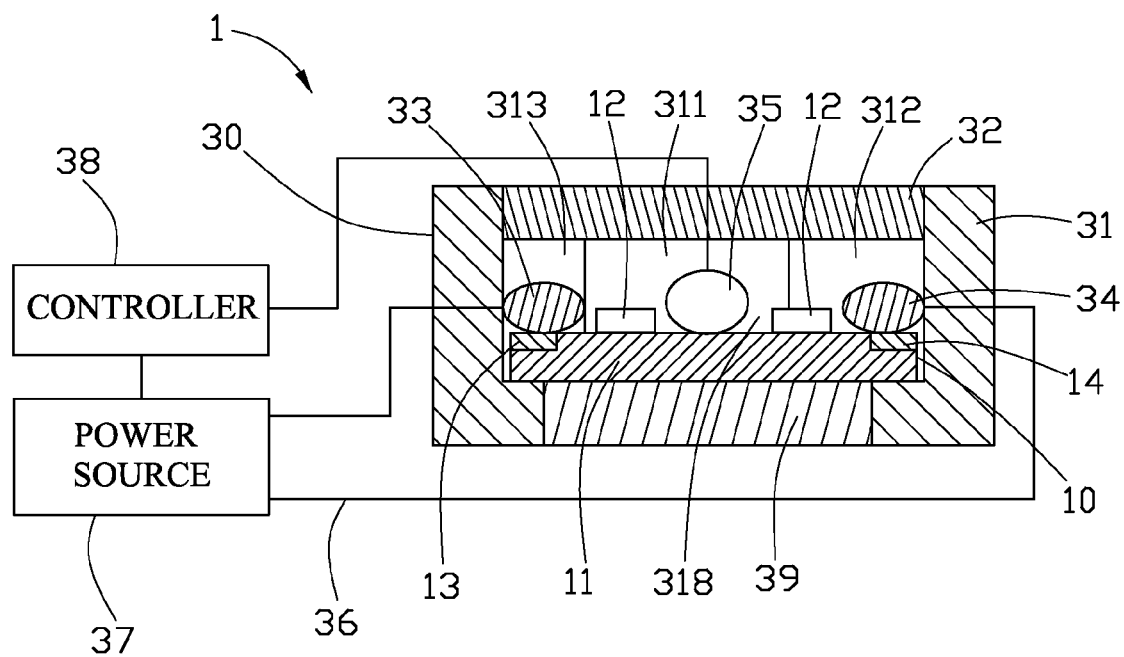
FIG. 7 is a schematic, cross-sectional view of the LED illuminating device of FIG. 1, taken along line VII-VII thereof.
Figure 8:
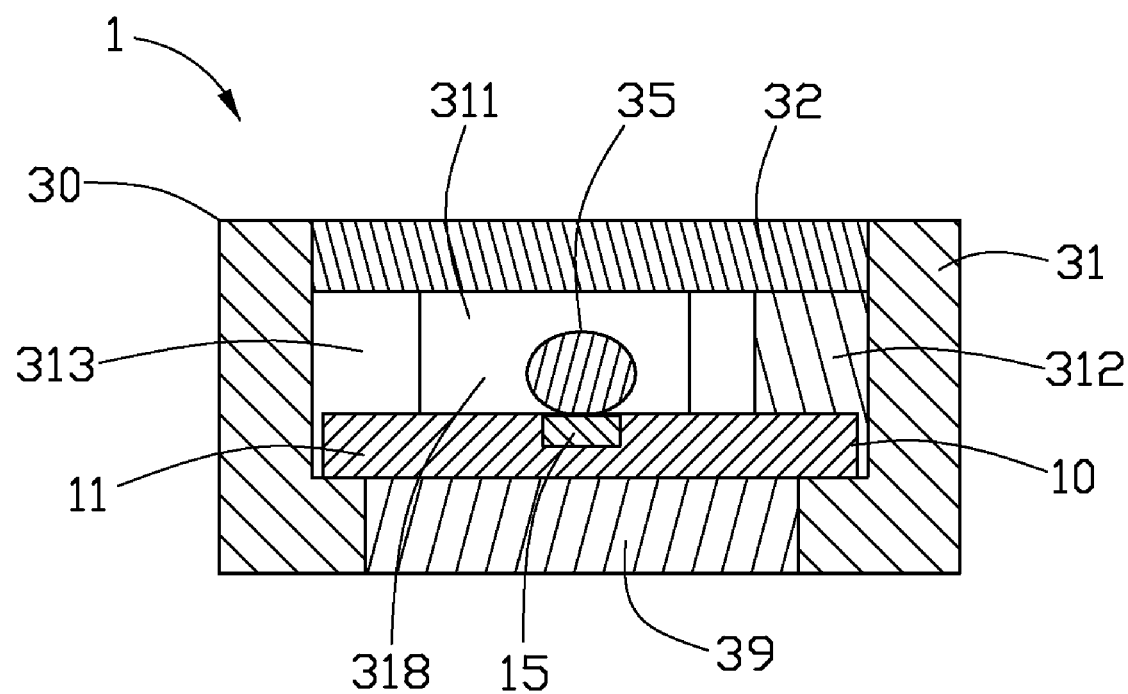
FIG. 8 is a schematic, cross-sectional view of the LED illuminating device of FIG. 1, taken along line VIII-VIII thereof.

Referring to FIGS. 7 and 8, during assembly of the illuminating device 1, the light source module 10 is detachably inserted into the light source chamber 311 through the opening 318, until the circuit board 11 of the light source module 10 abuts against the first fixing unit 313 in the light source chamber 311. Meanwhile, the cutout 111 of the light source module 10 also abuts against the corresponding protrusion 312 in the light source chamber 311. In addition, a bottom of the circuit board 11 of the light source module 10 is attached to and contacts with the heat dissipating block 39 of the power source module 30. The LEDs 12 of the light source module 10 face the lamp cover 32 of the power source module 30. The first and the second electrode contacts 13, 14 of the light source module 10 are respectively aligned with the first and the second electrical terminals 33, 34 of the power source module 30. The signal port 15 of the light source module 10 is aligned with the electrical coupler 35 of the power source module 30. As a result, the light source module 10 is electrically, thermally and mechanically connected to the power source module 30.

In the illuminating device 1, the light source module 10 is assembled to the power source module 30 merely by insertion of the light source module 10 into the power source module 30, which simplifies the assembly of the illuminating device 1. Furthermore, the light source module 10 is detachably inserted into the light source chamber 311 of the power source module 30. The light source module 10 and the power source module 30 can easily be replaced, or repaired, which decreases the cost of the illuminating device 1 over its lifetime. Moreover, in the illuminating device 1, the circuit board 11 of the light source module 10 is directly attached to the heat dissipating block 39 of the power source module 30. The heat generated from the LEDs 12 is transferred towards the heat dissipating block 39 from the circuit board 11, and then dissipated into an ambient atmosphere, thereby increasing the heat dissipating efficiency of the illuminating device 1, thus improving the light emitting efficiency and the life-span of the illuminating device 1.

Figure 9:
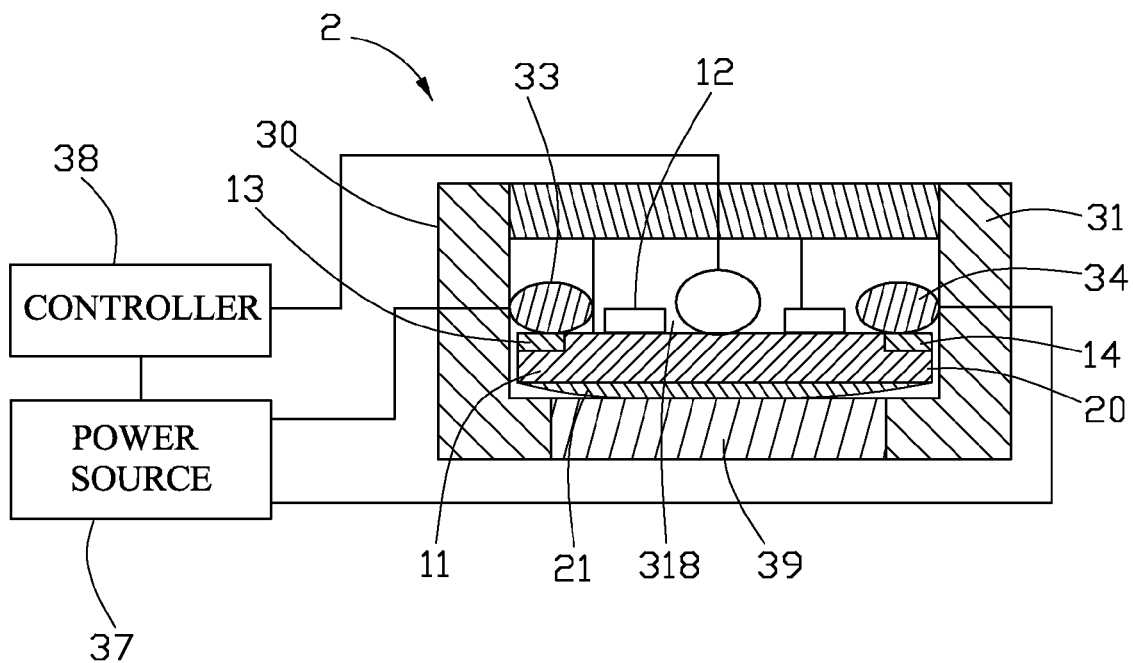
FIG. 9 is a schematic, cross-sectional view of an LED illuminating device in accordance with a second embodiment of the present invention.
Figure 10:
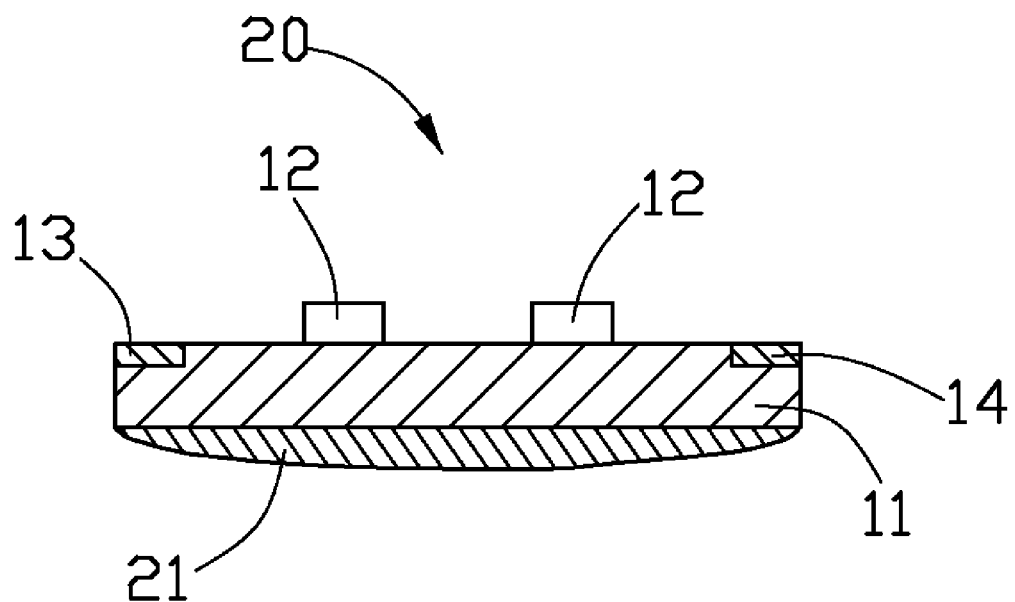
FIG. 10 is a schematic view, cross-sectional view of a light source module of the LED illuminating device of FIG. 9.

Referring to FIGS. 9 and 10, an LED illuminating device 2 in accordance with a second embodiment of the present invention is shown. The illuminating device 2 is similar to the illuminating device 1 in the previous first embodiment. In this embodiment, a thermal tape 21 is disposed below the circuit board 11 of the light source module 20. The thermal tape 21 is made of materials having good thermal conductivity and elastic capability, such as phase change metal alloy, thermal grease, silicone gap filler and so on. During assembly of the illuminating device 2, the thermal tape 21 of the light source module 20 is intimately attached to the heat dissipating block 39 of the power source module 30, which further increases the heat dissipating efficiency of the illuminating device 2.

Figure 11:
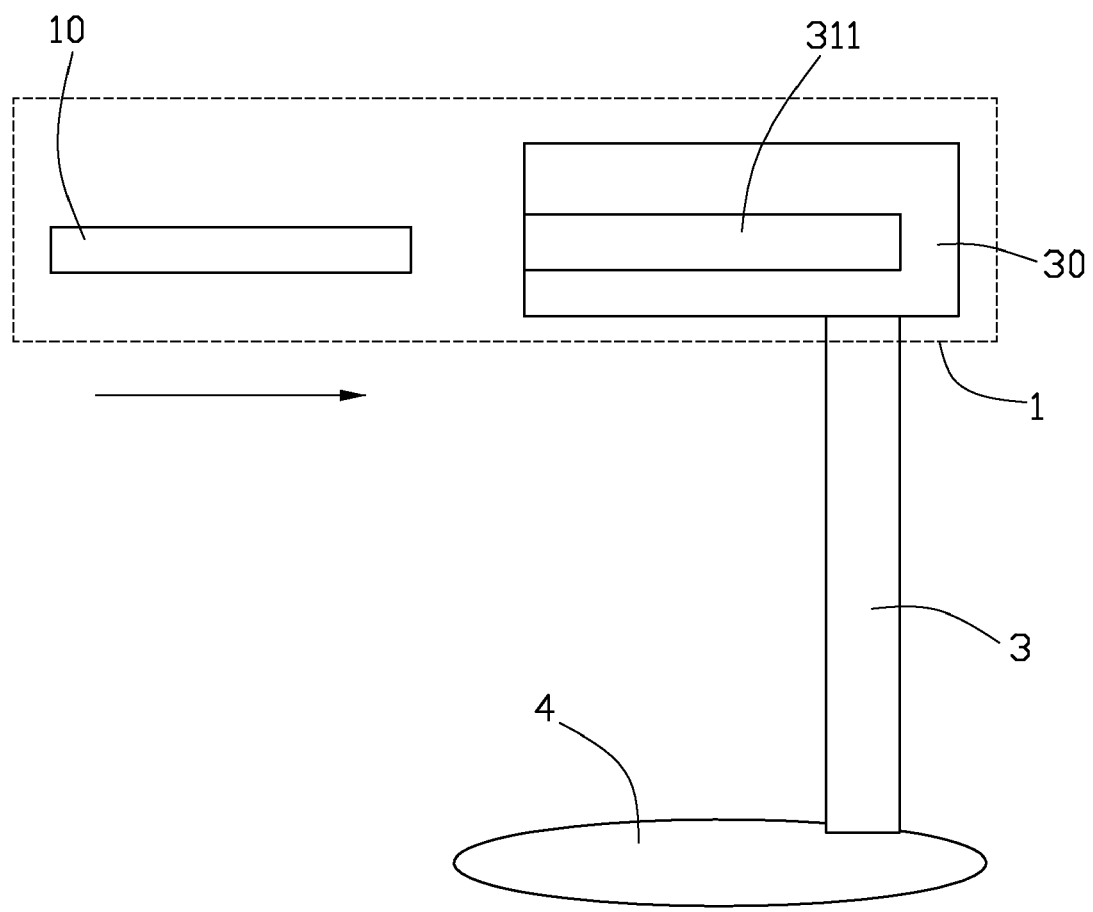
FIG. 11 is a schematic view of a desk lamp incorporating with the LED illuminating device of FIG. 1.

Referring to FIG. 11, a desk lamp incorporating the illuminating device 1 is shown. The desk lamp further includes a supporting pole 3 and a base 4. The illuminating device 1 is connected to a top end of the supporting pole 3 and a bottom end of the supporting pole 3 is connected to the base 4. It should be understood that the supporting pole 3 may be rigid or flexible. The light source module 10 is detachably inserted into the light source chamber 311 of the power source module 30, for thermally, electrically and mechanically connecting to the power source module 30. For the desk lamp, a user can quickly and freely select an expectant light source module, such as a warm light source, a cool light source and so on, by assembling and disassembling the light source from the light source chamber 311.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An LED illuminating device comprising:
    a light source module comprising a circuit board, an LED and a plurality of electrode contacts located on the circuit board, the LED electrically connected with the electrode contacts;
    a power source module comprising an enclosure defining a light source chamber therein and a plurality of electrical terminals received in the light source chamber, the light source module being detachably inserted into the light source chamber of the power source module, the electrode contacts abutting against the corresponding electrical terminals respectively;
    wherein the circuit board of the light source module is rectangular and defines a cutout at a corner thereof, and the power source module has a protrusion protruding into the light source chamber, the protrusion being engaged in the cutout, the engagement between the protrusion and the cutout ensuring that the light source module is properly and accurately mounted to the power source module.

2. The LED illuminating device as claimed in claim 1, wherein a heat dissipating block is disposed below the light source chamber of the enclosure, and the heat dissipating block is in thermally contact with the circuit board of the light source module.

3. The LED illuminating device as claimed in claim 2, wherein the heat dissipating block is integrally formed with the enclosure as a single piece.

4. The LED illuminating device as claimed in claim 2, wherein a thermal tape is sandwiched between the circuit board of the light source module and the heat dissipating block.

5. The LED illuminating device as claimed in claim 1, wherein the light source chamber of the power source module forms a fixing unit, and the fixing unit defines a groove therein, the circuit board of the light source module forming an elastic hook corresponding to the groove, the elastic hook being locked in the groove.

6. An LED illuminating device comprising:
 a housing defining a cavity therein and an opening in communication with the cavity, the housing having a light permeable portion at a first side of the cavity, and a heat dissipating block at an opposite second side of the cavity;
 a plurality of power source terminals disposed in the cavity for electrical connection to a power source;
 a circuit board having a plurality of electrical contacts; and
 an LED mounted on the circuit board, the LED electrically connected to the electrical contacts; wherein the circuit board is removably inserted in the cavity via the opening, the LED facing the light permeable portion, an opposite side of the circuit board to the LED in thermally contact with the heat dissipating block, the circuit board being rectangular and defining a cutout at a corner thereof, and the housing having a protrusion protruding into the cavity, the protrusion being engaged in the cutout, the engagement between the protrusion and the cutout ensuring that the electrical contacts of the circuit board are properly and accurately engaged with the power source terminals.

7. The LED illuminating device as claimed in claim 6, wherein the heat dissipating block is integrally formed with the housing as a single piece.

8. The LED illuminating device as claimed in claim 6, wherein a thermal tape is sandwiched between the circuit board and the heat dissipating block.

9. The LED illuminating device as claimed in claim 6, wherein a fixing unit is formed in the cavity of the housing and defines a groove therein, the circuit board forming an elastic hook corresponding to the groove, the elastic hook being locked in the groove.

10. A lamp comprising:
 a base;
 a supporting pole extending from the base;
 an LED illuminating device mounted on the supporting pole, the LED illuminating device comprising:
  a light source module comprising a circuit board, an LED, and a plurality of electrode contacts located on the circuit board, the LED electrically connected with the electrode contacts; and
  a power source module comprising an enclosure defining a light source chamber therein and a plurality of electrical terminals received in the light source chamber, the light source module being detachably inserted into the light source chamber of the power source module, the electrode contacts abutting against the corresponding electrical terminals respectively;
 wherein the circuit board of the light source module is rectangular and defines a cutout, at a corner thereof, and the power source module has a protrusion protruding into the light source chamber, the protrusion being engaged in the cutout, the engagement between the protrusion and the cutout ensuring that the light source module is properly and accurately mounted to the power source module.

11. The lamp as claimed in claim 10, wherein a heat dissipating block is disposed below the light source chamber of the enclosure, and the heat dissipating block is in thermally contact with the circuit board of the light source module.

12. The lamp as claimed in claim 11, wherein the heat dissipating block is integrally formed with the enclosure as a single piece.

13. The lamp as claimed in claim 11, wherein a thermal tape is sandwiched between the circuit board of the light source module and the heat dissipating block.

14. The lamp as claimed in claim 10, wherein the light source chamber of the power source module forms a fixing unit, and the fixing unit defines a groove therein, the circuit board of the light source module forming an elastic hook corresponding to the groove, the elastic hook being locked in the groove.

* * * * *